(12) United States Patent
Iwakado et al.

(10) Patent No.: US 9,947,569 B2
(45) Date of Patent: Apr. 17, 2018

(54) CARRIER TAPE AND PACK

(71) Applicant: NICHIA CORPORATION, Anan-shi, Tokushima (JP)

(72) Inventors: Naoki Iwakado, Anan (JP); Yosuke Tamura, Komatsushima (JP); Yukihiro Shibano, Anan (JP); Wataru Minamoto, Itano-gun (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/008,957

(22) Filed: Jan. 28, 2016

(65) Prior Publication Data
US 2016/0225654 A1    Aug. 4, 2016

(30) Foreign Application Priority Data

Jan. 30, 2015  (JP) .................................. 2015-016311
Dec. 26, 2015  (JP) .................................. 2015-255503

(51) Int. Cl.
*H01L 21/683*     (2006.01)
*B65D 73/02*      (2006.01)

(52) U.S. Cl.
CPC .......... *H01L 21/6836* (2013.01); *B65D 73/02* (2013.01); *H01L 2221/68313* (2013.01)

(58) Field of Classification Search
CPC .. B65B 9/00; B65B 9/04; B65B 9/045; B65D 73/02; B65D 85/38; H01L 21/683;
(Continued)

(56) References Cited

U.S. PATENT DOCUMENTS 4,702,370 A *  10/1987  Honda ................. B65D 75/327
                                                        206/714
5,132,160 A *   7/1992  Bird .................... H05K 13/0084
                                                        206/714
(Continued)

FOREIGN PATENT DOCUMENTS

JP       02-010256 A    1/1990
JP       2-10256 U      1/1990
(Continued)

OTHER PUBLICATIONS

Notification of Reasons for Refusal dated Jan. 31, 2017 corresponding to Japanese Patent Application No. 2015-255503, and English translation thereof.
(Continued)

*Primary Examiner* — Bryon Gehman
(74) *Attorney, Agent, or Firm* — Squire Patton Boggs (US) LLP

(57) ABSTRACT

A carrier tape is provided from which LEDs can be easily picked up. A carrier tape for accommodating an LED includes a sheet defining recessed embossed portions that can accommodate the LED. The embossed portion is formed to accommodate the LED which includes a light emitting portion having light-transmissive resin and arranged on its lateral surface as viewed in plan view. The embossed portion includes a protruding part that is arranged on one of the interior surfaces of the recessed embossed portion and can face the light emitting portion of the LED. Depressed parts are provided on the both sides of the protruding part so that the depressed surfaces can be spaced away from the LED when the LED is accommodated in the embossed portion. The width of the protruding part is smaller than the width of the light emitting portion of the LED as viewed in plan view.

10 Claims, 5 Drawing Sheets

(58) Field of Classification Search
CPC ...... H01L 21/6836; H01L 2221/68313; H05K 13/00; H05K 13/0084
USPC .......................................... 206/713, 714, 820
See application file for complete search history.

(56) References Cited

U.S. PATENT DOCUMENTS

| | | | |
|---|---|---|---|
| 7,646,605 B2* | 1/2010 | Ciccaglione | H05K 9/0067 206/714 |
| 8,338,845 B2* | 12/2012 | Watari | H01L 33/56 257/59 |
| 8,584,859 B2* | 11/2013 | Hiramatsu | H05K 13/0084 206/713 |
| 8,846,420 B2* | 9/2014 | Shiobara | H01L 33/486 438/113 |
| 2010/0109042 A1 | 5/2010 | Asakawa | |
| 2011/0186900 A1 | 8/2011 | Watari et al. | |
| 2015/0158649 A1* | 6/2015 | Huang | H05K 13/0084 206/714 |

FOREIGN PATENT DOCUMENTS

| | | |
|---|---|---|
| JP | 10-120075 A | 5/1998 |
| JP | 2007-036030 A | 2/2007 |
| JP | 2011-159768 A | 8/2011 |
| JP | 2011-171769 A | 9/2011 |
| JP | 2013-110288 A | 6/2013 |
| WO | 2008/117737 A1 | 10/2008 |

OTHER PUBLICATIONS

Japanese Office Action corresponding to JP Appln. No. 2015-255503, dated Sep. 12, 2017.

* cited by examiner

CARRIER TAPE AND PACK

CROSS-REFERENCE TO RELATED APPLICATIONS

The present application claims priority under 35 U. S. C. § 119 to Japanese Patent Application No. 2015-016,311, filed Jan. 30, 2015; and Japanese Patent Application No. 2015-255,503, filed Dec. 26, 2015. The contents of this application are incorporated herein by reference in their entirety.

BACKGROUND

1. Technical Field

The present invention relates to a carrier tape for accommodating an LED, and a pack including a carrier tape and an LED accommodated in the carrier tape.

2. Description of Related Art

Some electronic parts such as LEDs (i.e., Light Emitting Diodes) are accommodated in embossed portions (recessed portions) of embossed carrier tapes (hereinafter, also simply referred to as "carrier tapes") for storage and shipping. In known carrier tapes, the various sizes and shapes of embossed portions are selected according to the sizes and shapes of electronic parts to be accommodated in the embossed portions (see Laid-Open Patent Publication Nos. JP H02-10,256 A (1990) and H10-120,075 A (1998)). LEDs are light emitting devices, and can be categorized into top and side light emission types according to their arrangements when installed on a secondary substrate. The top light emission type LED has a light emitting portion (light emitting surface) which faces upward. The side light emission type LED has a light emitting portion which faces in a lateral direction. In the case of the side light emission type LED, its light emitting portion also faces in a lateral direction when accommodated in the embossed portion.

The light emitting portion of the LED is mainly formed of light-transmissive resin, which is suitably selected in consideration of optical properties such as extraction efficiency of light from its light emitting element embedded in the resin, and the like. For this reason, the light emitting portion may be formed of a resin material having a low hardness as compared with the base (package) of the LED. In the case where such a low-hardness resin material is used in the side light emission type LED, the LED may not be easily picked up from the embossed portion.

SUMMARY OF THE INVENTION

A carrier tape for accommodating an LED according to one embodiment of the present invention includes a sheet defining a recessed embossed portion that can accommodate the LED which includes a light emitting portion. The light emitting portion has light-transmissive resin, and is arranged on the side surface of the LED as viewed in plan view. The embossed portion includes a protruding part that is arranged on one of the interior surfaces of the recessed embossed portion and can face the light emitting portion of the LED. Depressed parts are provided on the both sides of the protruding part so that the depressed surfaces can be spaced away from the LED when the LED is accommodated in the embossed portion. The width of the protruding part is smaller than the width of the light emitting portion of the LED as viewed in plan view.

A carrier tape according to another aspect of the present invention includes a recessed embossed portion that can accommodate an LED including a light emitting portion that has light-transmissive resin and is arranged on its side surface. The embossed portion includes a protruding part on a part of its interior surface that can face the light emitting portion of the LED. The width of the protruding part is smaller than the width of the light emitting portion.

According to the above, it is possible to provide a carrier tape from which LEDs can be easily picked up.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENT(S)

Figure 1:
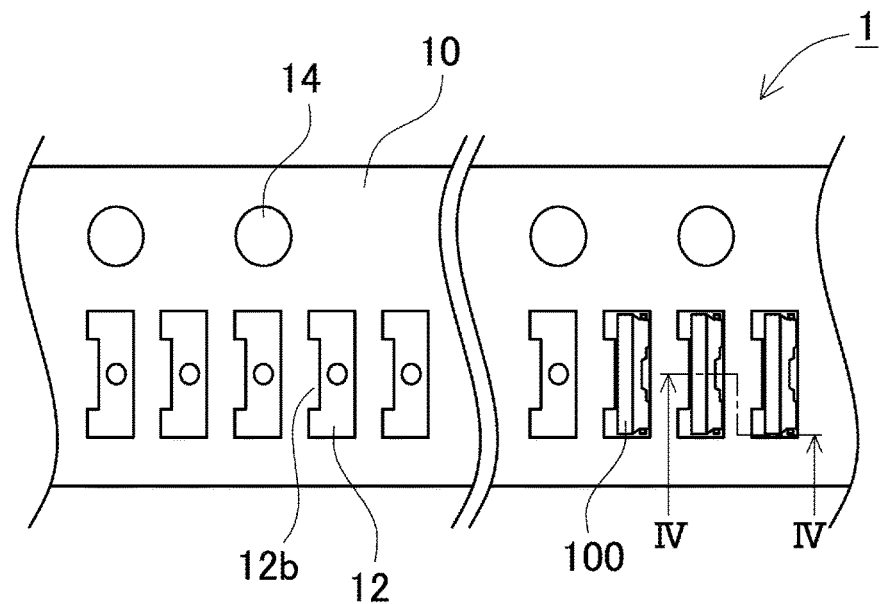
FIG. 1 is a schematic plan view showing a pack which includes a carrier tape and LEDs accommodated in some of embossed portions of the carrier tape according to an embodiment of the present invention.

The embodiments will now be described with reference to the accompanying drawings, wherein like reference numerals designate corresponding or identical elements throughout the various drawings. It should be appreciated, however, that embodiments described below are illustrations of a carrier tape and a pack to give a concrete form to technical ideas of the invention, and a carrier tape and a pack of the invention are not specifically limited to description below.

Furthermore, it should be appreciated that the members shown in claims attached hereto are not specifically limited to members in the embodiments. Unless otherwise specified, any dimensions, materials, shapes and relative arrangements of the parts described in the embodiments are given as an example and not as a limitation. Additionally, the sizes and the arrangement relationships of the members in each of the drawings are occasionally shown larger exaggeratingly for ease of explanation. Members same as or similar to those of this invention are attached with the same designation and the same reference signs, and their description is omitted.

In this specification, surfaces of a side light emission type LED to be accommodated in the carrier tape may be referred to as follows. In consideration that the LED includes a plurality of side surfaces, for ease of explanation, the side surface having a light emitting portion is referred to as the "front surface", and the side surface opposite to the front surface is referred to as the "back surface". The other two side surfaces of the LED located between the front and back surfaces are referred to as the "lateral surfaces".

Also, the surface of the LED that faces the bottom surface of an embossed portion when accommodated in the embossed portion is referred to as the "lower surface", and the surface opposite to the lower surface is referred to as the "top surface".

In this embodiment, the carrier tape is an elongated tape which has a plurality of embossed portions (recessed portions). Each embossed portion can accommodate the side surface light emission type (side view type) LED having a light emitting surface (light emitting portion) in the front surface, which is one of the side surfaces. The width of the front and back surfaces of the LED is greater than the width of the lateral surfaces. That is, the LED has a laterally oblong shape as viewed in plan view and front view. When accommodated in the embossed portion, the LED is orientated with the front and the back surfaces facing the longer interior surfaces of the embossed portion, and the two lateral surfaces facing the shorter interior surfaces of the embossed portion. The opposed longer sides of the embossed portion are substantially parallel to each other. Similarly, the opposed shorter sides are substantially parallel to each other. It is noted that the side surface of the embossed portion may be a single flat surface or have a stepped part, inclined part, or the like.

As discussed below, the LED mainly includes a package, a semiconductor light emitting element (hereinafter, referred to as a "light emitting element") that is mounted on the package, and light-transmissive resin that covers the light emitting element.

The package of the LED includes a recessed portion that is opened in the side surface (front surface), and the light emitting element is placed in the recessed portion. The recessed portion is filled with the light-transmissive resin. The opening of the recessed portion serves as the light emitting portion. After the light-transmissive resin is formed in the recessed portion, the height of the light-transmissive resin is lower in the part in proximity to the center than the side surface of the recessed portion. That is, in the front surface of the LED, the surface of the light-transmissive resin in the recessed portion is lower than the surface of the package.

A part of the light-transmissive resin may be formed on the package around the opening of the recessed portion, that is, on the package in the front surface of the LED around the light emitting portion. The light-transmissive resin is formed by being filled in the recessed portion of the package with a suitable amount for remaining within the recessed portion by using a dispenser, for example. However, the light-transmissive rein may overflow the recessed portion onto the package around the recessed portion in following manufacturing processes (e.g., curing process) depending on the conditions. Such a part of the light-transmissive resin which is arranged in parts of the package other than the recessed portion does not serve as the light emitting portion, and will not have important adverse effects on the optical properties.

On the other hand, the surface of such a part of the light-transmissive resin which is arranged in parts other than the recessed portion (i.e., on the package) in the front surface of the LED becomes higher than the surface of the light-transmissive resin of the light emitting portion in the recessed portion (protrudes frontward). For this reason, such a part of the light-transmissive resin which is arranged in the parts other than the recessed portion is likely to stick to the interior surface of the embossed portion of the carrier tape. In this embodiment, a protruding part is formed in a part of the interior surface of the embossed portion, more specifically in a part of the interior surface that faces the light emitting portion (i.e., the opening of the recessed portion) in the front surfaces of the LED so that the contact area between the carrier tape and the light-transmissive resin formed on the parts other than the recessed portion of the package can be small or zero. This construction can reduce the possibility that the LED sticks to the embossed portion.

When the protruding part is arranged in a part of the interior surface of the embossed portion is depressed parts are formed in other parts of the interior surface of the embossed portion. In other words, in the interior surface of the embossed portion which faces the front surface of the LED, the depressed parts are arranged in the parts of this interior surface that face the parts of the package around the light emitting portion. According to this arrangement, the aforementioned part of the light-transmissive resin which is arranged in the parts other than the light emitting portion of the LED can be unlikely to be in contact with the interior surface of the embossed portion.

The depressed parts are spaced away from the LED when the LED is accommodated in the embossed portion. The protruding part can be configured to be in contact with the light emitting portion of the LED when the LED is accommodated in the embossed portion. The depressed parts are preferably arranged on the both sides of the protruding parts as viewed in plan view. One of the interior surfaces of the embossed portion which has the depressed part arranged on the both sides of the protruding part can have a stepped shape between the protruding part and the depressed part.

Since the protruding part is arranged in the part of the interior surface of the embossed portion that faces the light emitting portion of the LED, the stick of the LED to the embossed portion can be reduced.

This arrangement is suitable for a carrier tape that can accommodate LEDs each of which has light-transmissive resin with its surface being lower than (depressed from) the package after the light-transmissive resin is formed in the recessed portion. With a pack that includes the carrier tape which accommodates the LEDs, the LEDs can be easily picked up from the pack, and therefore the picking-up error can be unlikely to occur in a process for mounting the LED on a secondary substrate, for example.

Description of the members will be given below.
(Carrier Tape)

The carrier tape is an elongated tape having embossed portions which are spaced at a predetermined interval (pitch) away from each other. Although depending on the size of the LED to be accommodated, the tape can have a width of approximately 8 to approximately 24 mm. Also, the length of the carrier tape can be suitably adopted by selecting the size of a reel, or the like. For example, the size of the reel can be a diameter of 180 mm, 330 mm, or the like. In the case of transferring a small quantity of LEDs, or the like, the carrier tape may be cut into pieces so that each of the pieces include at least an embossed portion, Each of the embossed portions has an opening that opens on the surface side (top surface side) of the carrier tape. The embossed portions are spaced at the predetermined interval from each other, and aligned in the feeding direction (the elongated direction) of the carrier tape. The interval can be any value which is suitably selected depending on the size of LED, and the like. The embossed portions are arranged in substantially the center part, or a part deviated rightward or leftward from the center in the width direction of the carrier tape. In addition, the carrier tape has through holes which are aligned along a line in parallel to the alignment of the embossed portions.

The through holes are feeding holes (sprocket holes) for feeding the carrier tape.

The embossed portion has the protruding part which is arranged in the part of its interior surface. The protruding part is located in the part that faces the light emitting portion of the LED to be accommodated, in particular, in the part that faces the light-transmissive resin which forms the light emitting portion. It is preferable that the width of the protruding part is smaller than the width of the light emitting portion. More specifically, the width of the protruding part is preferably in the range between 15% and 90% of the width of the light emitting portion. The width of the protruding part is more preferably in the range between 40% and 88%, and further preferably between 50% and 86% of the width of the light emitting portion. Since the light emitting portion of the LED is typically arranged in the center part of the front surface, it is preferable that the protruding part is correspondingly positioned in the center part of one of the longer interior surfaces of the embossed portion. Since the protruding part is arranged in the center part, the depressed parts are formed on the both sides of the protruding part. The depressed parts preferably have the same width. That is, the embossed portion preferably has a symmetric shape with respect to a line as viewed in plan view.

The "width of the protruding part" refers to the width (T1 in FIGS. 3A to 3C) of the most-protruding surface (hereinafter, also referred to as the "crest surface of the protruding part") that faces the light emitting portion of the LED. Also, the length of the protruding part (the length in the shorter side direction of the embossed portion) is referred to as the "protruding amount of the protruding part". In more detail, the protruding amount of the protruding part can be defined as the distance (D1 in FIGS. 3A to 3C) between the crest surface of the protruding part and the imaginary straight line that connects the two interior surfaces (depressed parts) on the both sides of the protruding part to each other on one of the longer side of the embossed portion.

The width of the protruding part can be fixed in the depth direction. Alternatively, the width of a part of the protruding part may be different from the other part. If the protruding part has different widths, it is preferable that the largest width of the protruding part is in the aforementioned preferable range (approximately between 15% and 90%, more preferably between 40% and 88%, and further preferably between 50% and 86%) of the width of the light emitting portion. In addition, the protruding amount of the protruding part is preferably in the range between 0.1 mm and 0.5 mm. The protruding part can continuously extend from the bottom to the top of the interior surface of the embossed portion. Alternatively, the protruding part may be spaced away from the top or the bottom of the interior surface corresponding to the location of the light emitting portion in the depth direction. One or more protruding parts may be provided for one light emitting portion. Also, in the case where each LED includes two or more light emitting portions, one protruding part can be provided for the two or more light emitting portions, or for each light emitting portion. The crest surface of the protruding part is preferably a flat surface as viewed in plan view. In addition, it is preferable that the edges of the crest surface of the protruding part are rounded, and the radius of curvature of the rounded edges is in the range approximately between 0.1 mm and 0.3 mm, for example, in terms of ease of embossing. However, the crest surface is not limited to this shape, and can entirely has a convex or concave shape. Alternatively, the crest surface of the protruding part may partially have an opening (slit), or the like, in other words, may have a shape other than one flat surface. Also, the angle of the protruding part that is formed by the crest surface and the bottom surface of the embossed portion can be a right angle as viewed in side view. Alternatively, the crest surface may be inclined relative to the bottom surface of the embossed portion. In the case where the crest surface is inclined, it is preferable that the angle between the crest surface and the bottom surface of the embossed portion is not smaller than 90 degrees, more preferably in the range between 90 degrees and 110 degrees in consideration of ease of embossing, ease of picking-up of the LED, and the like (for example, see FIG. 4).

Embossed portions of typical carrier tapes have a suitable clearance between their interior surface and electronic parts. In this embodiment, the embossed portion which includes the interior surface containing the protruding part also has a clearance between its interior surfaces and the LED to be accommodated. In order to reduce sticking of the LED to the interior surface of the embossed portion by the protruding part having a width smaller than the width of the light emitting portion, it is predicated on that the clearance is not too large. It is preferable that the clearance (C1 in FIG. 3A) on the longer side of the embossed portion (i.e., the clearance between the front or back surface of the LED and the interior surface of the embossed portion) is in the range from 0.05 to 0.15 mm. Having the clearance within this range and the protruding part in the embossed portion can reduce a risk that the LED sticks to the depressed part on the interior surface of the embossed portion even if the LED moves or rotates in the embossed portion. It is noted that this clearance does not mean the clearance between the LED and the depressed part, which is arranged on either side of the protruding part of the embossed portion, but means to the clearance between the crest surface of the protruding part and the front surface of the LED.

The interior surface of the embossed portion of the carrier tape can have a rough surface. For example, the surface roughness Sa of the interior surface of the embossed portion can be in the range approximately between 0.4 μm and 1.5 μm. The interior surface of the embossed portion can entirely or partially have such a rough surface. For example, the protruding part of the interior surface of the embossed portion preferably has such a surface roughness.

The embossed portions are spaced at the fixed interval (pitch) from each other. In the case where the protruding amount of the protruding part is large, the pitch will be correspondingly large. In consideration of working efficiency, and the like, the pitch is preferably in the range from approximately 2 to 4 mm. Although the protruding amount of the protruding part of the embossed portion is preferably in the range from 0.1 to 0.5 mm as discussed above, in particular, in the case of a pitch of 2 mm, the protruding amount is preferably in the range from 0.1 to 0.3 mm, while in the case of a pitch of 4 mm, the protruding amount is preferably in the range from 0.3 to 0.5 mm.

Also, from another viewpoint, it is preferable that the width T1 and the protruding amount D1 of the protruding part satisfy the following relationship (Equation 1).

$$0.04 < D1/T1 < 1.43 \qquad \text{(Equation 1)}$$

Figure 3A:
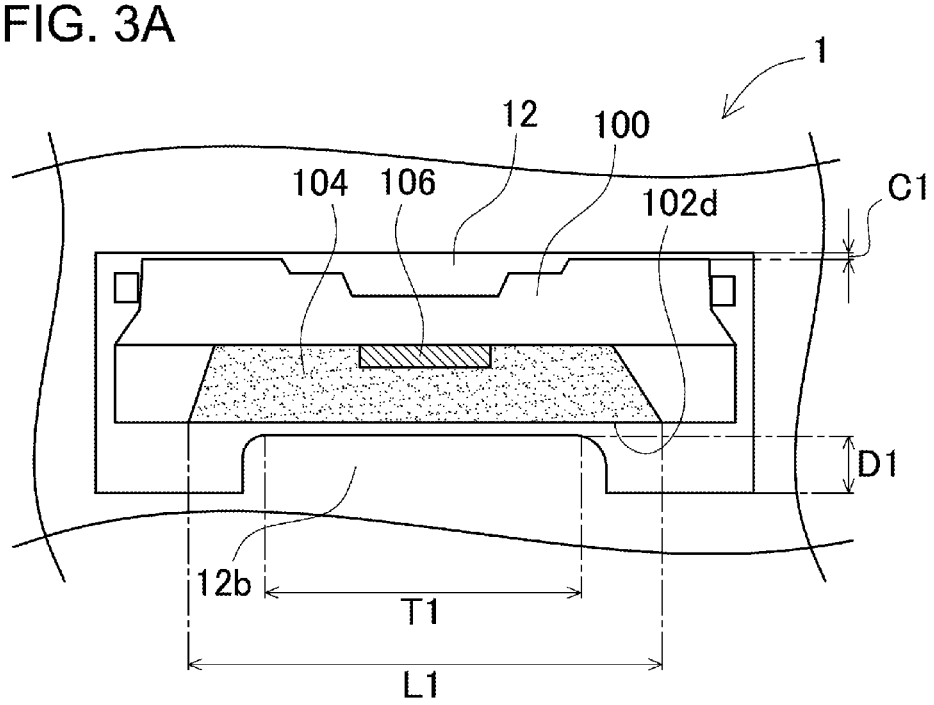
FIG. 3A is a schematic plan view showing a state that the LED is accommodated in the embossed portion of the carrier tape according to the embodiment of the present invention.
Figure 3B:
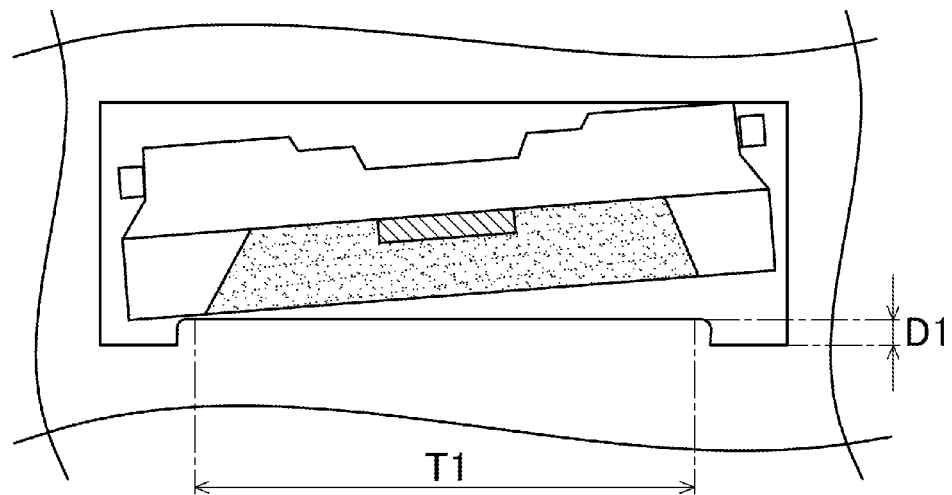
FIG. 3B is a schematic plan view showing a state that the LED is accommodated in the embossed portion of the carrier tape according to the embodiment of the present invention.
Figure 3C:
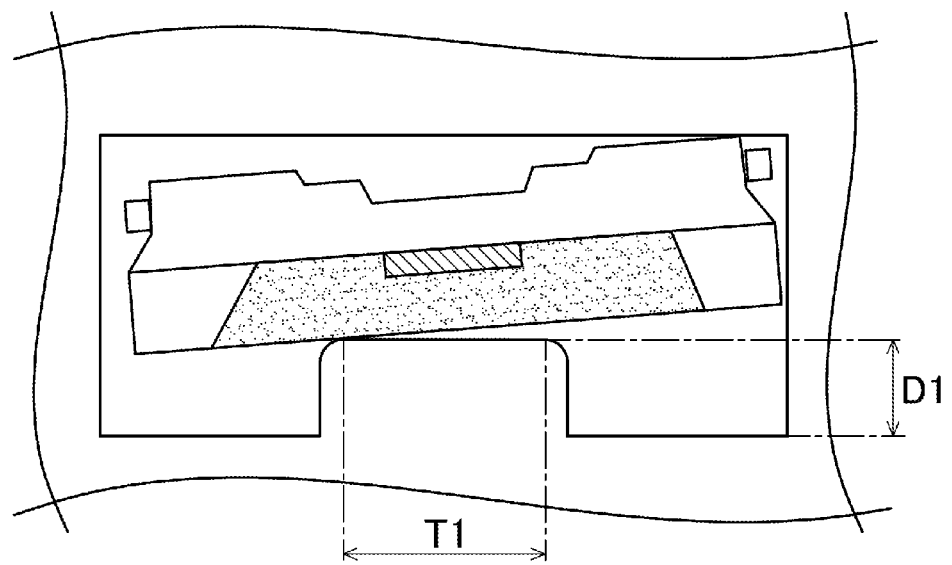
FIG. 3C is a schematic plan view showing a state that the LED is accommodated in the embossed portion of the carrier tape according to the embodiment of the present invention.

For example, FIG. 3A shows the LED 100 which does not tilt inside the embossed portion 12, while FIGS. 3B and 3C show the LEDs which tilt (rotate) inside the embossed portions. The width T1 of the protruding part is large while the protruding amount D1 of the protruding part is small in the case of FIG. 3B as compared with the case of FIG. 3A. Even with a small amount of protrusion, when the width and the protruding amount of the protruding part satisfy the relationship represented by Equation 1, the light emitting portion less likely to stick to the interior surface of the embossed portion (i.e., interior surface of the depressed part) even if the LED rotates inside the embossed portion.

The width T1 of the protruding part is small while the protruding amount D1 of the protruding part is large in the case of FIG. 3C as compared with the case of FIG. 3A. Even with the short length in width of the protruding part, when the width and the protruding amount of the protruding part satisfy the relationship represented by Equation 1, the light emitting portion less likely to stick to the interior surface of the embossed portion (i.e., interior surface of the depressed part) even if the LED rotates inside the embossed portion.

For example, the carrier tape which includes the above embossed portions can be formed from a sheet of a thermoplastic resin such as polycarbonate, polystyrene, acrylonitrile-butadiene-styrene-based resin (ABS resin), polyvinyl-chloride-based resin, polyethylene terephthalate, or polypropylene. This sheet is subjected to vacuum forming, pressure forming, press forming, or the like so that the embossed portions are formed in the carrier tape.

(LED)

The LEDs are accommodated in the embossed portions of the carrier tape. Each of the LEDs includes the package, the light emitting element, and the light-transmissive resin as main components.

The package of the LED includes an insulating member (e.g., resin, ceramics, glass epoxy resin, etc.), and electrically conducting members that serve as terminals, and includes the recessed portion which accommodates the light emitting element. The opening of the recessed portion serves as the light emitting portion of the LED. For example, the package can have a width of approximately 1.0 to 7.0 mm, a thickness of approximately 0.2 to 10 mm, and a length of approximately 0.3 to 10 mm. The recessed portion has the opening which is arranged on the side surface (front surface) of the package. The light emitting element is mounted in the recessed portion. Light emitted from the light emitting element travels in the light-transmissive resin, and then extracted to the outside of the opening.

The opening of the recessed portion of the package has a laterally oblong shape in the lateral surface (i.e., front surface) of the package. The width of the recessed portion can be in the range from approximately 0.2 to 6.9 mm, for example. The recessed portion is preferably arranged in the center in the width direction of the package. The width of the protruding part, which is arranged in the interior surface of the embossed portion of the carrier tape, is adjusted in accordance with the width of the opening of the recessed portion. The side surface (i.e., front surface) of the package is not limited to such a laterally elongated shape, but can be a square shape having a transverse length roughly equal to its lateral length or a transversely oblong shape. That is, the shape of the opening of the recessed portion of the package is not specifically limited as long as the light emitting portion (i.e., the opening of the recessed portion) faces the interior surface of the embossed portion when the LED is accommodated in the embossed portion.

The light-transmissive resin, which serves as the light emitting portion of the LED, is preferably formed of a resin material which facilitates extraction of the light from the light emitting element. Examples of electrically insulating resin compositions which are transmissive for the light from the light emitting element can be provided by a silicone resin composition, a modified silicone resin composition, an epoxy resin composition, a modified epoxy resin composition, an acrylic resin composition, and the like. A silicone resin, an epoxy resin, a urea resin, a fluorocarbon resin, a hybrid resin containing at least one resin selected from the group consisting of them, and the like can be also used as the light-transmissive resin. The light-transmissive resin formed of such a resin can contain a coloring material, a light-diffusing material, a light-reflective material, various types of fillers, a wavelength conversion material (phosphor), or the like, if required.

The light-transmissive resin has a Shore A hardness not greater than 75, or a Shore D hardness not greater than 70. It is preferable that the light-transmissive resin has a Shore A hardness not greater than 70, or a Shore D hardness not greater than 70. Although the resin having a hardness in the above range is likely to stick to the interior surface of the embossed portion, it can reduce a risk of sticking to the interior surfaces of the embossed portion by providing the protruding part in a part of the interior surfaces of the embossed portion. The Shore A or D hardness can be measured by a typical Shore A or D durometer according to the ASTM-D-2240 standard test method.

(Pack)

A pack includes the carrier tape and the LEDs, which are accommodated in the embossed portions of the carrier tape, and, a cover tape is attached onto the carrier tape of the pack so as to cover the openings of the embossed portions. The pack can be transferred in a state of including the carrier tape wound on a reel which has a reel core, for example.

In addition, when shipped from factories, the pack with the reel is enclosed with an anti-static bag.

First Embodiment

Figure 2A:
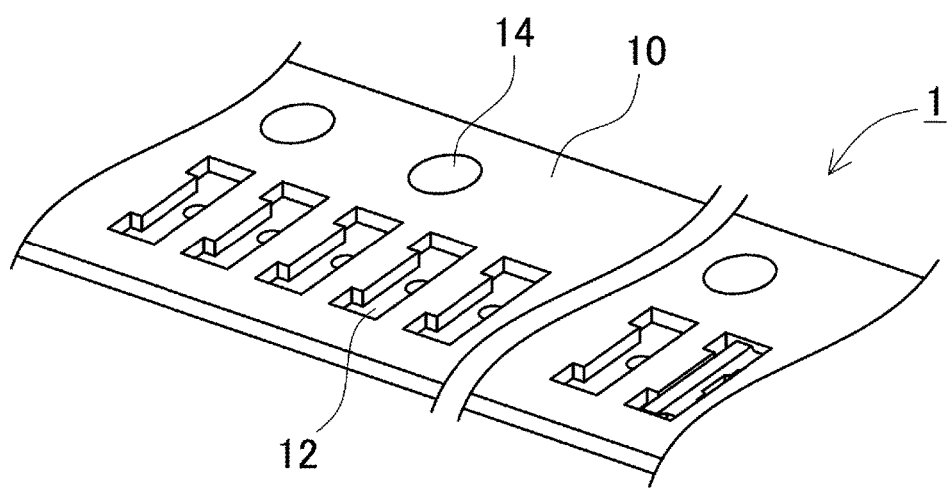
FIG. 2A is a schematic perspective view showing the pack which includes the carrier tape and the LED accommodated in one of the embossed portions of the carrier tape according to the embodiment of the present invention.
Figure 2B:
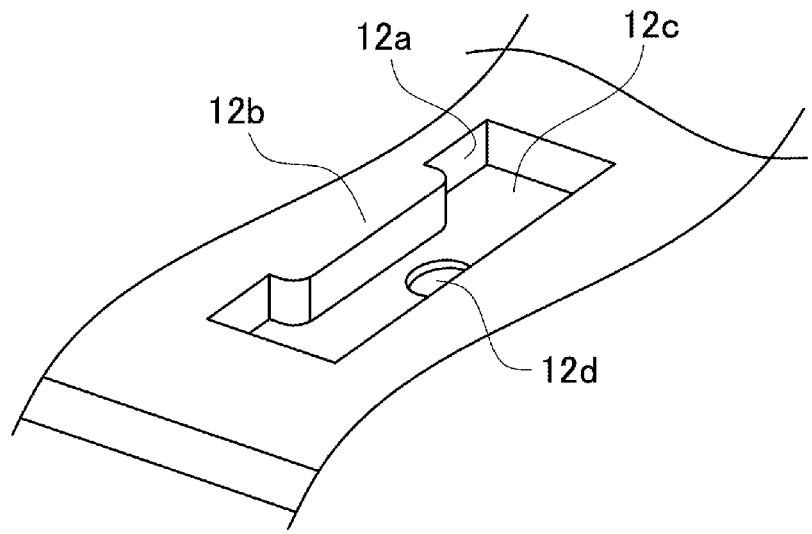
FIG. 2B is a partially enlarged schematic view of the carrier tape shown in FIG. 2A.
Figure 4:
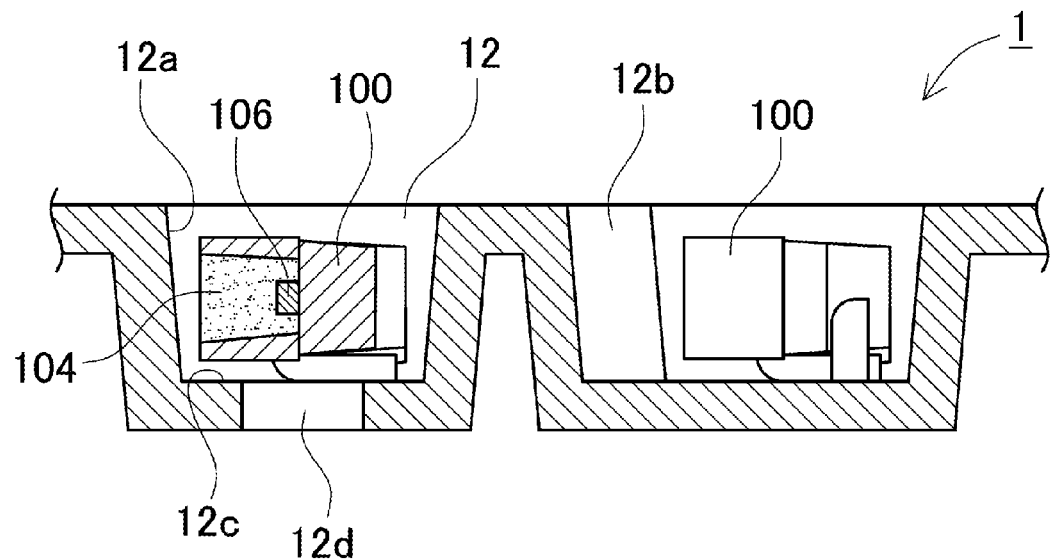
FIG. 4 is a schematic cross-sectional view along the line IV-IV of FIG. 1.
Figure 5:
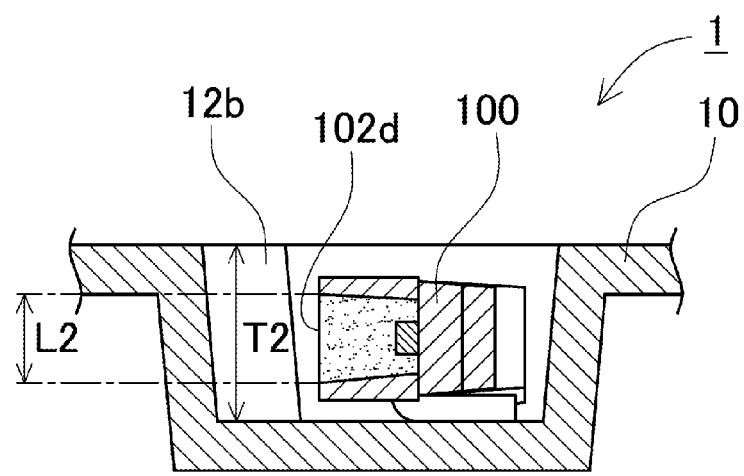
FIG. 5 is a schematic cross-sectional view showing a state that the LED is accommodated in the embossed portion of the carrier tape according to the embodiment of the present invention.
Figure 6:
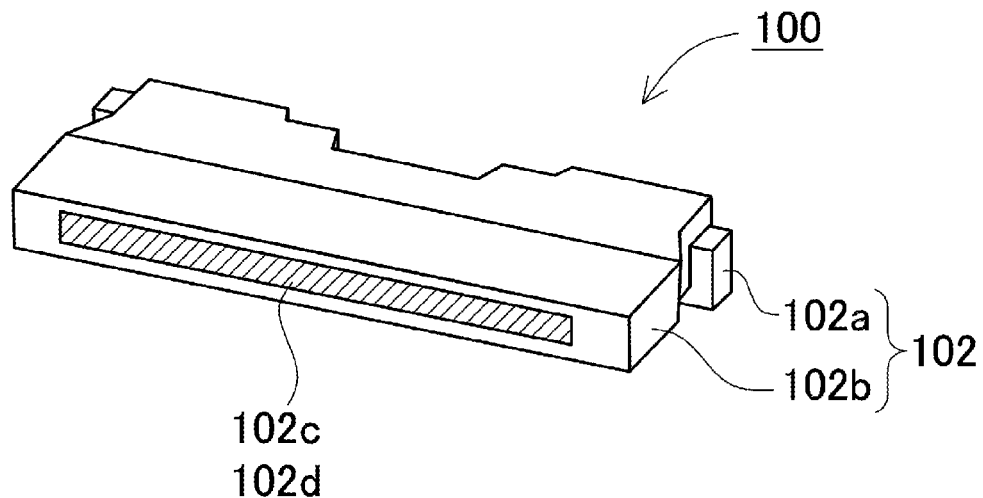
FIG. 6 is a schematic perspective view showing the LED to be accommodated in the embossed portion of the carrier tape according to the embodiment of the present invention.

FIG. 1 is a schematic plan view showing a part of a pack which includes the carrier tape 10 and the LEDs 100 accommodated in some of the embossed portions 12 of the carrier tape 10 according to a first embodiment of the present invention. FIG. 2A is a perspective view of the pack. FIG. 2B is an enlarged view of the embossed portion shown in FIG. 2A. FIGS. 3A to 3C are plan views of the embossed portions 12 and the LEDs 100 accommodated in these embossed portions with the LEDs 100 being shown in cross section for schematically illustrating their internal structures. FIG. 4 shows a cross-sectional view of the carrier tape and the LEDs taken along the stepped line IV-IV which passes through the center of one embossed portion and the lateral end part of other embossed portion in FIG. 1. In FIG. 4, the left-side cross-sectional part is taken along one segment of the line IV-IV that passes through the light emitting element, and the shaded interior surfaces of the embossed portion shown on the left side does not include the protruding part. On the other hand, the right-side cross-sectional part is taken along other segment of the line A-A that does not pass through the protruding part, and the protruding part is shown behind the shaded interior surfaces of the embossed portion on the right side. FIG. 5 is a cross-sectional plan views of the embossed portions 12 and the LED 100 accommodated in this embossed portion with the LEDs 100 being also shown in cross section for schematically illustrating its internal structure. FIG. 6 is a perspective view of the LED 100.

The carrier tape 10 according to the first embodiment comprises a resin sheet which is mainly made of polycarbonate as the principal component and has a width of approximately 8.0 mm and a thickness of approximately 0.2 mm, for example. In this embodiment, the LED 100 has a width of approximately 3.00 mm, a thickness of approximately 0.40 mm, and a length of approximately 0.85 mm (i.e., the distance from the lateral surface (i.e., front surface), which includes the light emitting portion, to the back surface). The embossed portion 12 of the carrier tape 10 has an oblong shape in plan view. The length of the longer side (i.e., the width), the length of the shorter side (i.e., the depth), and the depth of the embossed portion 12 are approximately 3.15 mm, 1.00 mm, and 0.55 mm, respectively. The length of the longer side of the embossed portion corresponds to the width of the LED.

The LED 100 has the opening of the recessed portion on the lateral surface (i.e., front surface) of the package 102. As shown in FIGS. 3A and 5, the lateral length L1, and the transverse length L2 of the opening 102*d* of the recessed portion are approximately 2.2 mm, and 0.3 mm, respectively. The width (i.e., lateral length) of the embossed portion 12 is approximately 3.15 mm, while the width T1 of the protruding part 12*b* is approximately 1.35 mm. It is noted that the edges of the lateral surface of the protruding part 12*b* (i.e., the surface facing the light emitting portion of the LED) are rounded, and the width of the surface that is arranged the closest to the LED (i.e., the crest surface of the protruding part) is defined as the width of the protruding part 12*b* (i.e., the width T1 of the protruding part).

The height T2 of the protruding part 12*b* of the embossed portion 12 is the distance from the bottom to the top of the embossed portion 12, in other words, the same as the depth of the embossed portion 12, as shown in FIG. 5. Although the protruding part has been illustratively described to have the height same as the depth of the embossed portion, the protruding part is not limited to this. The height T2 of the protruding part can be dimensioned to a value greater than the length L2 in the transverse direction (height) of the light emitting portion 102*d*.

Second Embodiment

Figure 7:
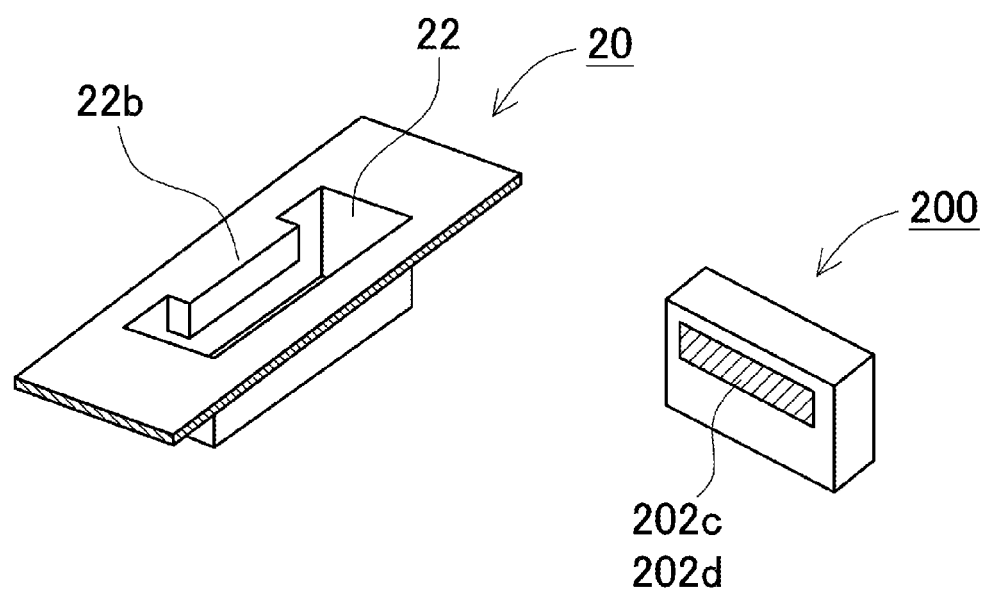
FIG. 7 is a schematic perspective view showing an embossed portion of a carrier tape, and an LED to be accommodated in the embossed portion of the carrier tape according to another embodiment of the present invention.

FIG. 7 is a schematic plan view showing a carrier tape 20 and an LED 200 to be accommodated in its embossed portion 22 according to a second embodiment of the present invention. The LED 200 has a recessed portion 202*c*, which is arranged at a location on its lateral surface deviated to the top side and serves as the light emitting portion 202*d*. A protruding part 22*b* of the interior surface of the embossed portion 22 is correspondingly arranged at the location which is deviated to the top side and faces the light emitting portion 202*d*. That is, the protruding part has a height smaller than the depth of the embossed portion 22.

A carrier tape according to the present invention can be used as carrier types for LEDs to be used as a light source for lighting, light sources for various types of indicators, a light source for vehicle, a light source for liquid crystal display back light, and a light source for sensor.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims.

What is claimed is:

1. A carrier tape comprising:
a recessed embossed portion accommodating a light emitting diode (LED) of a side view package, the recessed embossed portion having an interior surface positioning the LED, the LED including a light emitting portion of a recessed portion that is opened in a side surface of the LED, the recessed portion filled with a light transmissive resin, wherein
said embossed portion includes a protruding part on a part of the interior surface that faces said light emitting portion of the LED, and a width of the protruding part is smaller than a width of said light emitting portion.

2. The carrier tape according to claim 1, wherein
depressed parts are formed on both sides of said protruding part, and
said protruding part and said depressed parts, which are arranged on the both sides of the protruding part, form a stepped shape.

3. The carrier tape according to claim 1, wherein the width of said protruding part is between 15% and 90% of the width of said light emitting portion of the LED.

4. The carrier tape according to claim 1, wherein the protruding amount of said protruding part is in the range between 0.1 mm and 0.5 mm.

5. The carrier tape according to claim 1, wherein a width T1 and a protruding amount D1 of the protruding part satisfy the following relationship:

$$0.04 < D1/T1 < 1.43.$$

6. The carrier tape according to claim 1, wherein said protruding part is formed to be in contact with the light emitting portion of the LED when the LED is accommodated in the embossed portion.

7. The carrier tape according to claim 1, wherein a height of said protruding part extends from the bottom to the top of said embossed portion.

8. A pack comprising the carrier tape according to claim 1, and the LED that is accommodated in the embossed portion of the carrier tape.

9. The pack according to claim 8, wherein said light-transmissive resin of the LED contains silicone.

10. The pack according to claim 8, wherein said light-transmissive resin has a Shore A hardness not greater than 75, or a Shore D hardness not greater than 70.

* * * * *